US009536848B2

(12) United States Patent
England et al.

(10) Patent No.: US 9,536,848 B2
(45) Date of Patent: Jan. 3, 2017

(54) BOND PAD STRUCTURE FOR LOW TEMPERATURE FLIP CHIP BONDING

(71) Applicant: GLOBALFOUNDRIES Inc., Grand Cayman (KY)

(72) Inventors: Luke England, Saratoga Springs, NY (US); Christian Klewer, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/515,969

(22) Filed: Oct. 16, 2014

(65) Prior Publication Data

US 2016/0111386 A1    Apr. 21, 2016

(51) Int. Cl.
*H01L 23/00*  (2006.01)
*H01L 25/00*  (2006.01)
(Continued)

(52) U.S. Cl.
CPC .............. *H01L 24/09* (2013.01); *H01L 23/522* (2013.01); *H01L 24/06* (2013.01); *H01L 24/08* (2013.01); *H01L 25/0657* (2013.01); *H01L 25/50* (2013.01); *H01L 24/03* (2013.01); *H01L 24/05* (2013.01); *H01L 24/80* (2013.01); *H01L 2224/03616* (2013.01); *H01L 2224/05551* (2013.01); *H01L 2224/05553* (2013.01); *H01L 2224/05554* (2013.01);
(Continued)

(58) Field of Classification Search
CPC ......... H01L 24/04–24/06; H01L 24/28–24/30; H01L 24/65–24/67; H01L 2224/06051;H01L 2225/06513; H01L 2224/0612–2224/06133
See application file for complete search history.

(56) References Cited

U.S. PATENT DOCUMENTS 5,686,762 A * 11/1997 Langley .................. H01L 24/05
                                                            257/775
6,236,114 B1 * 5/2001 Huang ..................... H01L 24/05
                                                            257/758
(Continued)

FOREIGN PATENT DOCUMENTS

JP   WO 2012161044 A1 * 11/2012 ........... H01L 23/522
TW        201308560 A      2/2013

OTHER PUBLICATIONS

Taiwan Office Action for related Taiwan Patent Application No. 104117607, dated Jun. 3, 2016, 7 Pages.
(Continued)

*Primary Examiner* — Joshua King
(74) *Attorney, Agent, or Firm* — Ditthavong & Steiner, P.C.

(57) ABSTRACT

Methods for preparing 3D integrated semiconductor devices and the resulting devices are disclosed. Embodiments include forming a first and a second bond pad on a first and a second semiconductor device, respectively, the first and the second bond pads each having plural metal segments, the metal segments of the first bond pad having a configuration different from a configuration of the metal segments of the second bond pad or having the same configuration as a configuration of the metal segments of the second bond pad but rotated with respect to the second bond pad; and bonding the first and second semiconductor devices together through the first and second bond pads.

6 Claims, 5 Drawing Sheets

(51) Int. Cl.
*H01L 25/065* (2006.01)
*H01L 23/522* (2006.01)

(52) U.S. Cl.
CPC ............... *H01L 2224/05647* (2013.01); *H01L 2224/0603* (2013.01); *H01L 2224/06133* (2013.01); *H01L 2224/08121* (2013.01); *H01L 2224/08123* (2013.01); *H01L 2224/08145* (2013.01); *H01L 2224/80013* (2013.01); *H01L 2224/80895* (2013.01); *H01L 2224/80896* (2013.01); *H01L 2224/80948* (2013.01); *H01L 2224/80986* (2013.01); *H01L 2224/94* (2013.01); *H01L 2225/06527* (2013.01)

(56) References Cited

U.S. PATENT DOCUMENTS

| | | | | |
|---|---|---|---|---|
| 6,448,641 | B2* | 9/2002 | Ker | H01L 23/5222 257/700 |
| 6,552,433 | B1* | 4/2003 | Chou | H01L 24/05 257/750 |
| 8,431,436 | B1* | 4/2013 | Nguyen | H01L 23/488 257/E21.499 |
| 8,802,538 | B1* | 8/2014 | Liu | H01L 25/50 257/E21.48 |
| 2005/0064693 | A1* | 3/2005 | Liu | H01L 24/05 438/612 |
| 2005/0263884 | A1* | 12/2005 | Sawada | H01L 23/49816 257/737 |
| 2006/0246268 | A1* | 11/2006 | Honjo | H05K 1/0253 428/209 |
| 2010/0314149 | A1* | 12/2010 | Gerrish | H01L 23/3107 174/50.52 |
| 2013/0087930 | A1* | 4/2013 | Meinhold | H01L 23/53238 257/782 |
| 2014/0145338 | A1* | 5/2014 | Fujii | H01L 23/522 257/762 |

OTHER PUBLICATIONS

Taiwan Patent Search Report for related Taiwan Patent Application No. 104117607, dated Jun. 2, 2016, 1 Page.

* cited by examiner

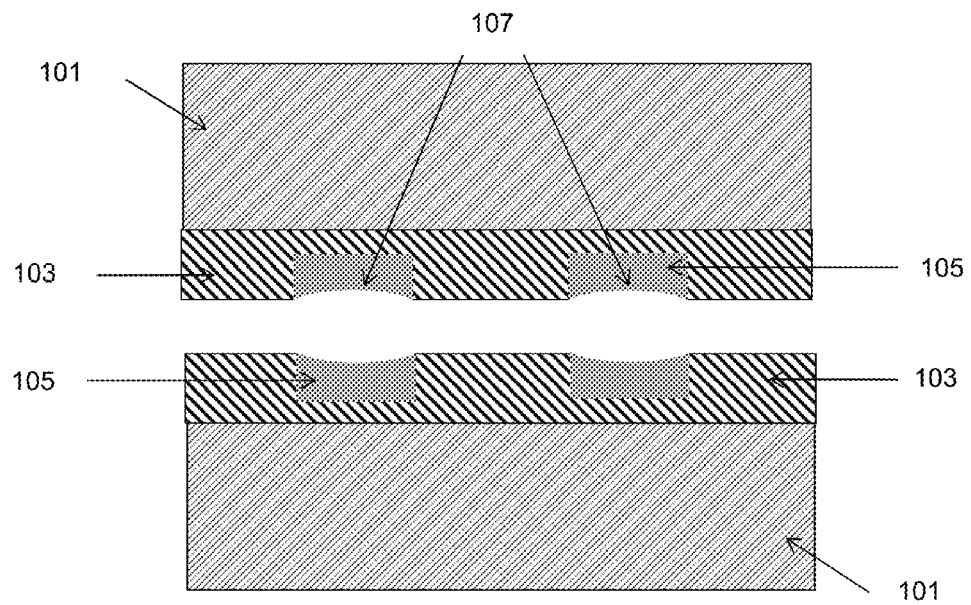
FIG. 1A BACKGROUND
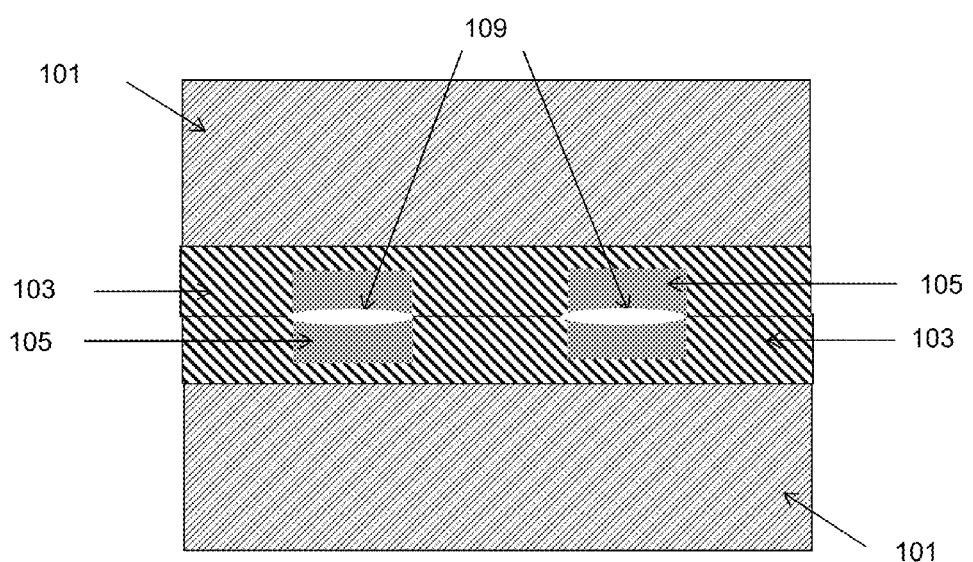
FIG. 1B BACKGROUND

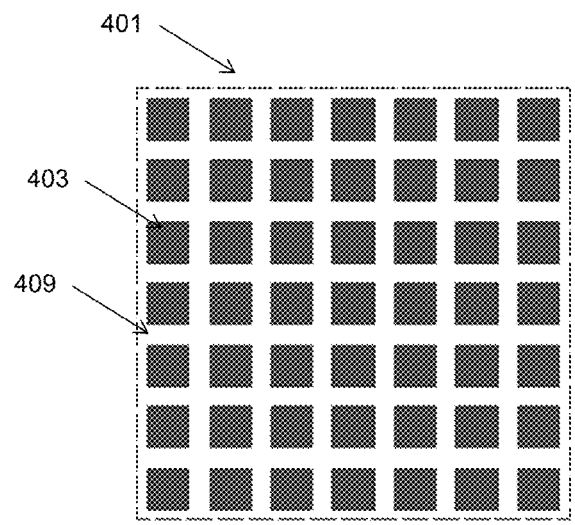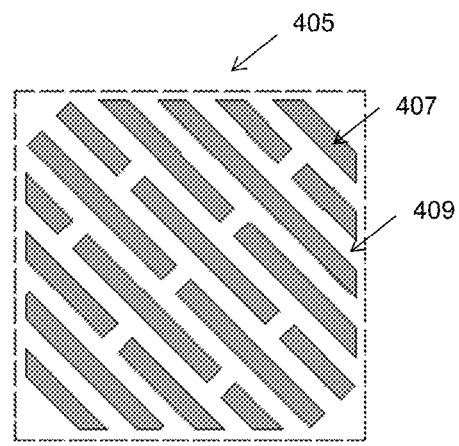
FIG. 4A  FIG. 4B
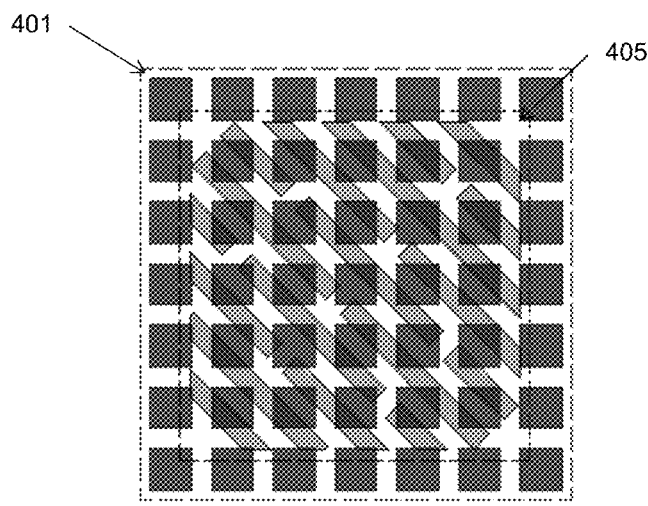
FIG. 4C

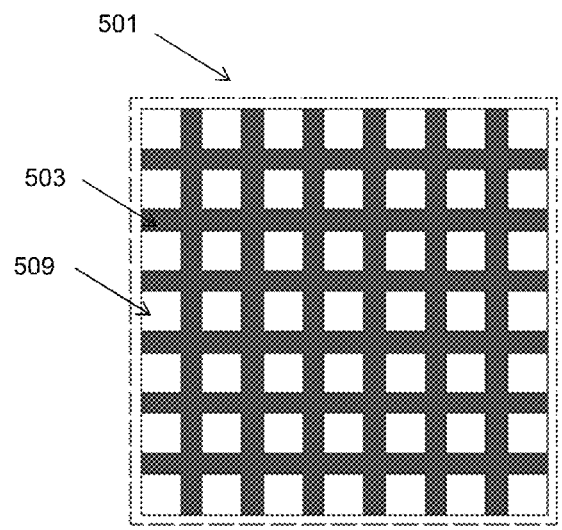
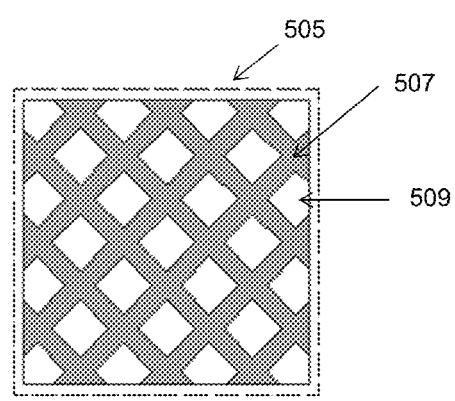
FIG. 5A  FIG. 5B
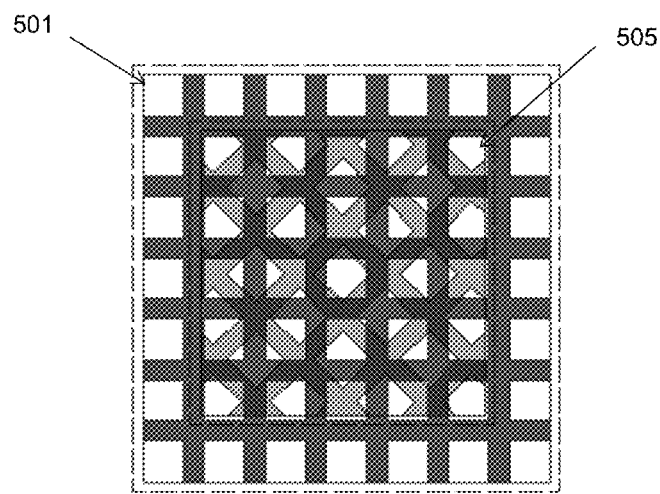
FIG. 5C

BOND PAD STRUCTURE FOR LOW TEMPERATURE FLIP CHIP BONDING

TECHNICAL FIELD

The present disclosure relates to fabrication of three-dimensional (3D) integrated semiconductor devices. In particular, the present disclosure relates to bond pad structures for low temperature flip chip bonding.

BACKGROUND

One of the emerging chip architectures/technologies for both integrated circuits (ICs) and microelectro-mechanical systems (MEMS) is 3D integration based on bonding together semiconductor devices with pre-fabricated components. For example, a flip chip is a method for interconnecting semiconductor devices by flipping over one of the devices so that its top side faces down, aligning the bond pads to match with the other device's bond pads, and bonding the devices together. Prior to the flipping, aligning, and bonding, vias and bond pads are patterned on pre-processed wafers and filled by a copper damascene process. Specifically, dielectric layers, for example low temperature inorganic dielectrics such as silicon dioxide ($SiO_2$), silicon nitride ($Si_3N_4$), and/or silicon carbide (SiC) are formed on the wafer and etched to form vias. Then, copper is deposited in the vias by plating or chemical vapor deposition (CVD) of the copper. Since copper diffuses rapidly in dielectrics, a barrier material such as TiN is deposited as a liner before copper is deposited. Excess copper is then removed and the surface of the copper and dielectric layer is planarized by chemical-mechanical polishing (CMP). The preprocessed wafers are aligned and bonded together at or near room temperature using chemical or plasma activated fusion bonding processes compatible with back-end-of-the-line (BEOL) wafers. As the surfaces of the dielectric layers are physically bonded together, the planar copper layers come in contact and, after annealing, interconnects between the devices are formed through copper-to-copper bonds in the bond pads for both structural integrity and inter-wafer electrical interconnections.

As shown in FIGS. 1A and 1B, a Si device (either a wafer or die) 101 having a dielectric layer 103 and copper bond pads 105, when subjected to CMP often results in dishing 107 of the bond pads. When two planarized Si devices 101 are joined, aligned and bonded together, dishing leads to voids 109 in the copper interconnect. Since even a few nanometers of dishing below the dielectric surface can prevent successful joint formation, the dishing of the bond pads needs to be controlled or minimized. (In FIGS. 1A and 1B, the top and bottom dies only show the top pad in a BEOL stack for illustration convenience. There may be multiple metal/dielectric layers in the BEOL stack.)

A need therefore exists for methodology enabling fabrication of 3D integrated ICs and MEMS with controlled and/or reduced dishing at the bond pads.

SUMMARY

An aspect of the present disclosure relates to methods for fabricating a 3D integrated semiconductor device, in which the effect of dishing of bond pad surfaces after CMP and the resulting voids between joined semiconductor devices is avoided or minimized by adjoining bond pads with different or rotated configurations of metal segments.

Another aspect relates to a device having adjoined bond pads with different or rotated configurations of metal segments.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first and a second bond pad on a first and a second semiconductor device, respectively, the first and the second bond pads each having plural metal segments, the metal segments of the first bond pad having a configuration different from a configuration of the metal segments of the second bond pad or having the same configuration as a configuration of the metal segments of the second bond pad but rotated with respect to the second bond pad; and bonding the first and second semiconductor devices together through the first and second bond pads.

Aspects of the present disclosure also include forming a larger first bond pad on the first semiconductor device compared to the second bond pad on the second semiconductor device. Other aspects include patterning the first and second bond pads on the first and second semiconductor devices, respectively, by a copper damascene process. Still other aspects include surrounding the first and second bond pads on the first and second semiconductor devices, respectively, by a dielectric layer. Further aspects include bonding the first and second semiconductor devices together through the dielectric layers in a chemical or plasma activated fusion bonding process. Still further aspects include using a low temperature inorganic layer around the metal segments of the first and second semiconductor devices, and planarizing the first and second bond pads and the low temperature inorganic layer on the first and second semiconductor devices, respectively, by CMP before bonding together. Additional aspects include patterning the bond pads on the first and second semiconductor devices by a copper damascene process, and bonding the first and second semiconductor devices together through copper-to-copper bonds in the patterned bond pads. Other additional aspects include arranging the metal segments of the first bond pad on the first semiconductor device into columns of segments, the columns being staggered with respect to each other, and arranging the metal segments of the second bond pad on the second semiconductor device into rows of segments, the rows being staggered with respect to each other, wherein the columns of segments are perpendicular to the rows of segments. Still other additional aspects include arranging the metal segments of the first bond pad on the first semiconductor device into columns and rows of metal islands, and arranging the metal segments of the second bond pad on the second semiconductor device into lines of segments, the lines being staggered with respect to each other, wherein the lines of segments are at a 45 degree angle to the columns and rows of metal islands. Further aspects include arranging the metal segments of first bond pad on the first semiconductor device into a first grid of rows and columns, and arranging the metal segments of the second bond pad on the second semiconductor device into a second grid of rows and columns, wherein the second grid of rows and columns is at a 45 degree angle with respect to the first grid of rows and columns.

According to the present disclosure, some technical effects may be achieved in part by a method including forming a first bond pad with metal segments forming a pattern having a first orientation on a first semiconductor device; forming a second bond pad with metal segments forming a pattern having a second orientation on a second semiconductor device, wherein the first orientation is at a 45 degree to a 90 degree angle with respect to the second orientation; and bonding the first and second semiconductor devices together through the first and second bond pads.

Aspects of the present disclosure also include having the first orientation and the second orientation perpendicular to each other. Other aspects include having the first and second semiconductor devices include low temperature inorganic dielectric layers, and bonding the first and second semiconductor devices together through the low temperature inorganic dielectric layers through a chemical or plasma activated fusion bonding process. Still other aspects include patterning the bond pads by a copper damascene process, and bonding the first and second semiconductor devices together through copper-to-copper bonds in the damascene patterned copper first and second bond pads.

According to the present disclosure, some technical effects may be achieved in part by a device including a first and a second semiconductor device having first and second bond pads, respectively, bonded together through the first and second bond pads, the first and second bond pads each having plural metal segments, the metal segments of the first bond pad having a configuration different from a configuration of the metal segments of the second bond pad or having a configuration rotated with respect to a configuration of the metal segments of the second bond pad.

Aspects of the present disclosure also include having the first bond pad on the first semiconductor device larger than the second bond pad on the second semiconductor device. Other aspects include the first and second bond pads each having plural copper segments. Still other aspects include having the first configuration rotated at a 45 degree to a 90 degree angle with respect to the second configuration. Further aspects include arranging the metal segments of the first bond pad on the first semiconductor device into columns of segments, the columns being staggered with respect to each other, and arranging the metal segments of the second bond pad on the second semiconductor device into rows of segments, the rows being staggered with respect to each other, wherein the columns of segments are perpendicular to the rows of segments. Still further aspects include arranging the metal segments of the first bond pad on the first semiconductor device into columns and rows of metal islands, and arranging the metal segments of the second bond pad on the second semiconductor device into lines of segments, the lines being staggered with respect to each other, wherein the lines of segments are at a 45 degree angle to the columns and rows of metal islands. Additional aspects include arranging the metal segments of first bond pad on the first semiconductor device into a first grid of rows and columns, and arranging the metal segments of the second bond pad on the second semiconductor device into a second grid of rows and columns, wherein the second grid of rows and columns is at a 45 degree angle with respect to the first grid of rows and columns.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A and 1B illustrate a conventional 3D integration of semiconductor devices;

FIGS. 4A through 4C illustrate another bond pad pattern, according to an exemplary embodiment; and FIGS. 5A through 5C illustrate another bond pad pattern, according to an exemplary embodiment.

DETAILED DESCRIPTION

Figure 2A:
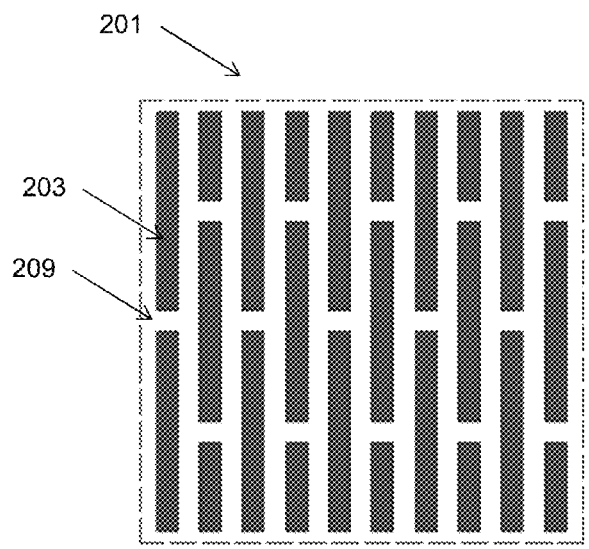
FIGS. 2A through 2C illustrate a bond pad pattern, according to an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of dishing of bond pad surfaces attendant upon CMP of the bond pad surfaces prior to bonding and the resulting voids in interconnects between semiconductor devices, e.g., ICs and MEMS, in 3D integrated devices. In order to avoid or minimize the effect of dishing of bond pad surfaces after CMP and the resulting voids between semiconductor devices, a method in accordance with embodiments of the present disclosure includes forming a first and a second bond pad on a first and a second semiconductor device, respectively, the first and the second bond pads each having plural metal segments, the metal segments of the first bond pad having a configuration different from a configuration of the metal segments of the second bond pad or having the same configuration as a configuration of the metal segments of the second bond pad but rotated with respect to the second bond pad; and bonding the first and second semiconductor devices together through the first and second bond pads.

The replacement of large solid bond pads used in conventional 3D integration processes with bond pads having different configurations or rotated configurations between two semiconductor devices, minimizes the effect of copper dishing during planarization by CMP and the resulting voids between adjoined semiconductor devices and allows for improved bonding. That is, rather than a single large point of contact between the bond pads on adjoined devices, interconnects are formed through multiple smaller contact points. The bond pad design can be adjusted to allow for required resistance values depending on specific needs of each interconnect function (i.e. power/ground, I/O, etc). The integration falls directly within existing dual damascene process techniques, so it can be easily implemented. It also allows the elimination of top bond pad layers for improved flip chip cost structure as well.

The first and second semiconductor devices may be bonded together in a face-to-face (F2F), wafer-to-wafer (W2W), die-to-wafer (D2W), or die-to-die (D2D) manner. The first bond pad on the first device may be larger than the second bond pad on the second device to allow for any misalignment during placement, especially for individual die placement, e.g. D2W or D2D. The first and second bond pads on the first and second devices, respectively, may be patterned in the dielectric layers on the devices by a copper damascene process. The first and second devices may be bonded together through the dielectric layers using a chemical or plasma activated fusion bonding process. The first and second devices may include a low temperature inorganic layer around the metal segments, in which the first and second bond pads and the low temperature inorganic layer are planarized to be ultra-smooth by CMP before bonding together. The bond pads on the first and second may be patterned by a damascene process and the first and second devices may be bonded together through copper-to-copper bonds in the patterned bond pads.

Figure 2B:
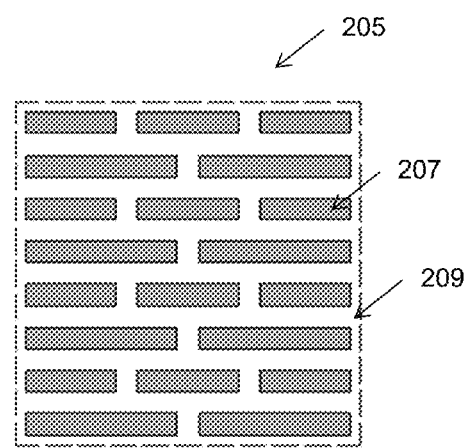
Figure 2C:
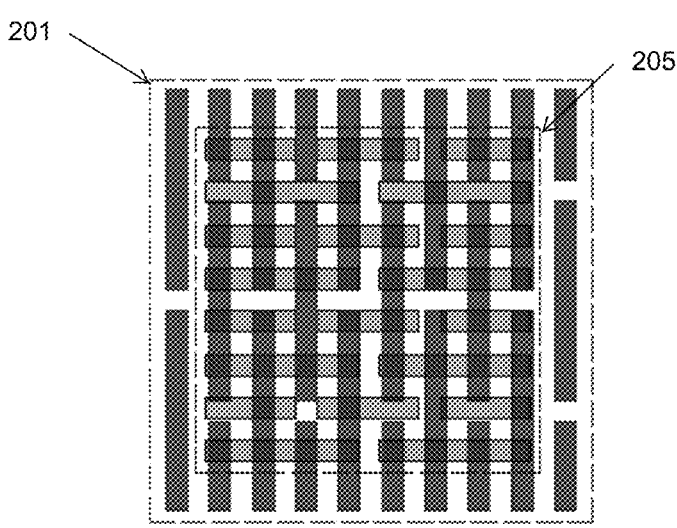

FIGS. 2A through 2C illustrate the metal segments of bond pads having a pattern of perpendicular lines, in accordance with an exemplary embodiment. As shown in FIG. 2A, the metal segments of the first bond pad 201 on the first semiconductor device (not shown for illustrative convenience) include columns of segments 203, the columns being staggered with respect to each other. The metal segments of the second bond pad 205 on the second semiconductor device (not shown for illustrative convenience) include rows of segments 207, the rows being staggered with respect to each other, as illustrated in FIG. 2B. As shown, the columns of segments 203 are perpendicular to the rows of segments 207. However, the angle could range from 45° to 90°. Also shown in FIGS. 2A and 2B is a dielectric 209 surrounding the first and second bond pads. The dielectric layers may, for example, be low temperature inorganic dielectric layers. Further the bond pads may be patterned in the dielectric layers by a copper damascene process. FIG. 2C illustrates the overlay of the metal segments of the first bond pad 201 on the metal segments of the second bond pad 205. The two semiconductor devices may be bonded together through the dielectric layers, e.g. by chemical or plasma activated fusion bonding. In addition, as the bond pads may be copper, the devices may be bonded through copper-to-copper bonds formed after annealing.

Figure 3:
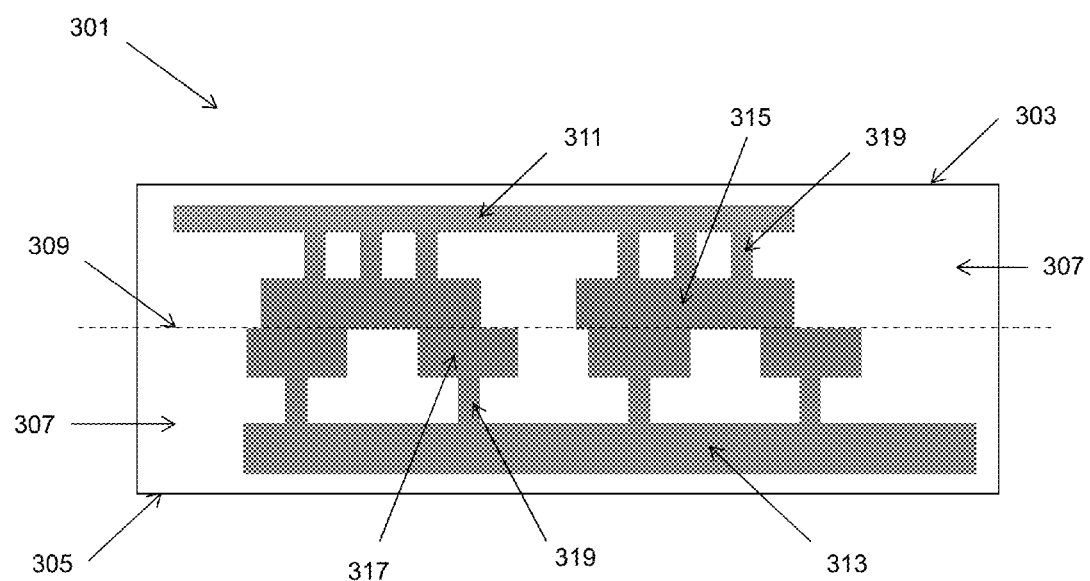
FIG. 3 illustrates a cross-sectional view of a 3D integration of semiconductor devices, according to an exemplary embodiment.

FIG. 3 illustrates a cross-sectional view of a 3D integration 301 for F2F bonding of two semiconductor devices with the metal segments of bond pads having a pattern of perpendicular lines. The device 301 includes top die 303 and bottom die 305, each of which includes a dielectric layer 307. Dies 303 and 305 are joined together along bond plane 309. Also shown are the top and bottom metal routing layers, 311 and 313, respectively, which are connected to the top and bottom bond pads, 315 and 317, respectively, through vias 319. As illustrated, the bond pads 315 and 317 are in good contact with each other along the bond plane 309. (In FIG. 3, the top and bottom dies only show the top pad in a BEOL stack for illustration convenience. There may be multiple metal/dielectric layers in the BEOL stack.)

FIGS. 4A through 4C illustrate the metal segments of bond pads having a pattern of lines on islands, in accordance with an exemplary embodiment. As shown in FIG. 4A, the metal segments of the first bond pad 401 on the first semiconductor device (not shown for illustrative convenience) include columns and rows of metal islands 403. Adverting to FIG. 4B, the metal segments of the second bond pad 405 on the second semiconductor device (not shown for illustrative convenience) include lines of diagonal segments 407, the lines being staggered with respect to each other. As shown, the lines of segments 407 are at a 45° angle to the columns and rows of metal islands 403. However, the angle could range from 45° to 90°. A dielectric 409 surrounds the first and second bond pads. The dielectric layers may, for example, be low temperature inorganic dielectric layers. Further the bond pads may be patterned in the dielectric layers by a copper damascene process. FIG. 4C illustrates the overlay of the metal segments of the first bond pad 401 on the metal segments of the second bond pad 405. The two semiconductor devices may be bonded together through the dielectric layers, e.g. by chemical or plasma activated fusion bonding. In addition, as the bond pads may be copper, the devices may be bonded through copper-to-copper bonds formed after annealing.

FIGS. 5A through 5C illustrate the metal segments of bond pads having a pattern of an alternating cross-hatch, in accordance with an exemplary embodiment. As shown in FIG. 5A, the metal segments of first bond pad 501 on the first semiconductor device (not shown for illustrative convenience) include a first grid 503 of rows and columns. As illustrated in FIG. 5B, the metal segments of the second bond pad 505 on the second semiconductor device (not shown for illustrative convenience) include a second grid 507 of rows and columns. As shown, the second grid 507 of rows and columns is at a 45 degree angle with respect to the first grid 503 of rows and columns. A dielectric 509 surrounds the first and second bond pads. The dielectric layers may, for example, be low temperature inorganic dielectric layers. Further the bond pads may be patterned in the dielectric layers by a copper damascene process. FIG. 5C illustrates the overlay of the metal segments of the first bond pad 501 on the metal segments of the second bond pad 505. The two semiconductor devices may be bonded together through the dielectric layers, e.g. by chemical or plasma activated fusion bonding. In addition, as the bond pads may be copper, the devices may be bonded through copper-to-copper bonds formed after annealing.

As described above and shown in FIGS. 2A through 2C, the metal segments of the bond pads on the semiconductor devices may have a pattern of perpendicular lines. Alternatively, as described above and shown in FIGS. 4A through 4C, the metal segments of bond pads on the semiconductor devices may have a pattern of lines on islands. Further, as described above and shown in FIGS. 5A through 5C, the metal segments of bond pads on the semiconductor devices may have a pattern of an alternating cross-hatch. However, other configurations in which the bond pads meet in small areas, rather than the entire pad are possible as well. In addition, although not shown for illustrative convenience, the first bond pad may be larger than the second bond pad.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects.

Accordingly, the drawings and description are to be regarded as illustrative in nature, and not as restrictive.

The embodiments of the present disclosure can achieve several technical effects, such as reduced dishing resulting in improved interconnect contacts for ICs or MEMS implemented with existing dual damascene techniques. Devices formed in accordance with embodiments of the present disclosure are useful in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a first and a second bond pad on a first and a second semiconductor device, respectively, the first and the second bond pads each having plural metal segments, the metal segments of the first bond pad having a configuration different from a configuration of the metal segments of the second bond pad or having the same configuration as a configuration of the metal segments of the second bond pad but rotated with respect to the second bond pad; and
    bonding the first and second semiconductor devices together through the first and second bond pads,
    wherein the metal segments of the first bond pad on the first semiconductor device comprise only columns of segments, the columns being staggered with respect to each other, and the metal segments of the second bond pad on the second semiconductor device comprise only rows of segments, the rows being staggered with respect to each other, wherein the columns of segments are perpendicular to the rows of segments.

2. The method according to claim 1, comprising forming a larger first bond pad on the first semiconductor device than the second bond pad on the second semiconductor device.

3. The method according to claim 1, comprising patterning the first and second bond pads on the first and second semiconductor devices, respectively, by a copper damascene process.

4. The method according to claim 1, further comprising surrounding the first and second bond pads on the first and second semiconductor devices, respectively, by a dielectric layer; and
    bonding the first and second semiconductor devices together through the dielectric layers in a chemical or plasma activated fusion bonding process.

5. The method according to claim 1, wherein the first and second semiconductor devices include a low temperature inorganic layer around the metal segments, the method further comprising planarizing the first and second bond pads and the low temperature inorganic layer on the first and second semiconductor devices, respectively, by Chemical Machine Polishing (CMP) before bonding together.

6. The method according to claim 1, further comprising patterning the bond pads on the first and second semiconductor devices by a copper damascene process, and bonding the first and second semiconductor devices together through copper-to-copper bonds in the patterned bond pads.

* * * * *